(12) United States Patent
Lo

(10) Patent No.: US 8,116,087 B2
(45) Date of Patent: Feb. 14, 2012

(54) BRACKET FOR FASTENING PRINTED CIRCUIT BOARD TO AN ENCLOSURE OF AN ELECTRONIC DEVICE

(75) Inventor: Wu-Jen Lo, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 250 days.

(21) Appl. No.: 12/686,541

(22) Filed: Jan. 13, 2010

(65) Prior Publication Data

US 2010/0259907 A1    Oct. 14, 2010

(30) Foreign Application Priority Data

Apr. 10, 2009   (CN) .................... 2009 2 0302054 U

(51) Int. Cl.
*H05K 7/12* (2006.01)
(52) U.S. Cl. .................. 361/759; 361/747; 361/740
(58) Field of Classification Search .................. 361/726, 361/732, 740, 747, 801, 759
See application file for complete search history.

(56) References Cited

U.S. PATENT DOCUMENTS

| | | | | |
|---|---|---|---|---|
| 5,674,023 A * | 10/1997 | Williams | ...................... | 403/231 |
| 6,351,395 B1 * | 2/2002 | Karkowski et al. | ........... | 361/825 |
| 6,576,847 B2 * | 6/2003 | Marketkar et al. | ............ | 174/255 |
| 6,585,448 B2 * | 7/2003 | Grossman et al. | ............ | 403/403 |
| 7,292,458 B1 * | 11/2007 | Chern et al. | .................. | 361/807 |
| 7,554,815 B2 * | 6/2009 | Hardt et al. | ................... | 361/753 |

* cited by examiner

*Primary Examiner* — Dameon Levi
(74) *Attorney, Agent, or Firm* — Altis Law Group, Inc.

(57) ABSTRACT

A printed circuit board (PCB) bracket is used to fasten a PCB with a positioning hole to an enclosure of an electronic device. The PCB bracket includes a base portion defining a screw hole, a supporting arm, a spring arm and a screw. The supporting arm vertically extends from the base portion and includes a first clamping portion apart from and parallel with the base portion. The first clamping portion is inserted into the positioning hole. The spring arm includes a second clamping portion disposed between the first clamping portion and the base portion. The screw is screwed through the enclosure, the screw hole of the base portion and abuts against the urging portion, so that the spring arm is out of shape and drives the first clamping portion toward the second clamping portion so as to fasten the PCB.

5 Claims, 4 Drawing Sheets

BRACKET FOR FASTENING PRINTED CIRCUIT BOARD TO AN ENCLOSURE OF AN ELECTRONIC DEVICE

BACKGROUND

1. Technical Field

The present disclosure relates to printed circuit board (PCB) brackets, and in particular to a bracket for fastening a PCB to an enclosure of an electronic device.

2. Description of Related Art

Generally, an electronic device includes one or more ports to communicate with other electronic devices via cables for data transmission. Typically, those ports are affixed to a daughterboard connected to a main board of the electronic device via a male/female connector pair. The ports are subjected to tremendous external pressure during plugging and disconnection of the cable from the ports. Under the external forces, the male/female connector pair is prone to be damaged and connection between the daughterboard and the main board becomes bad.

It is thus desirable to provide a PCB bracket for fastening the daughterboard to an enclosure of the electronic device so as to ameliorate the aforedescribed limitations.

DETAILED DESCRIPTION

Figure 1:
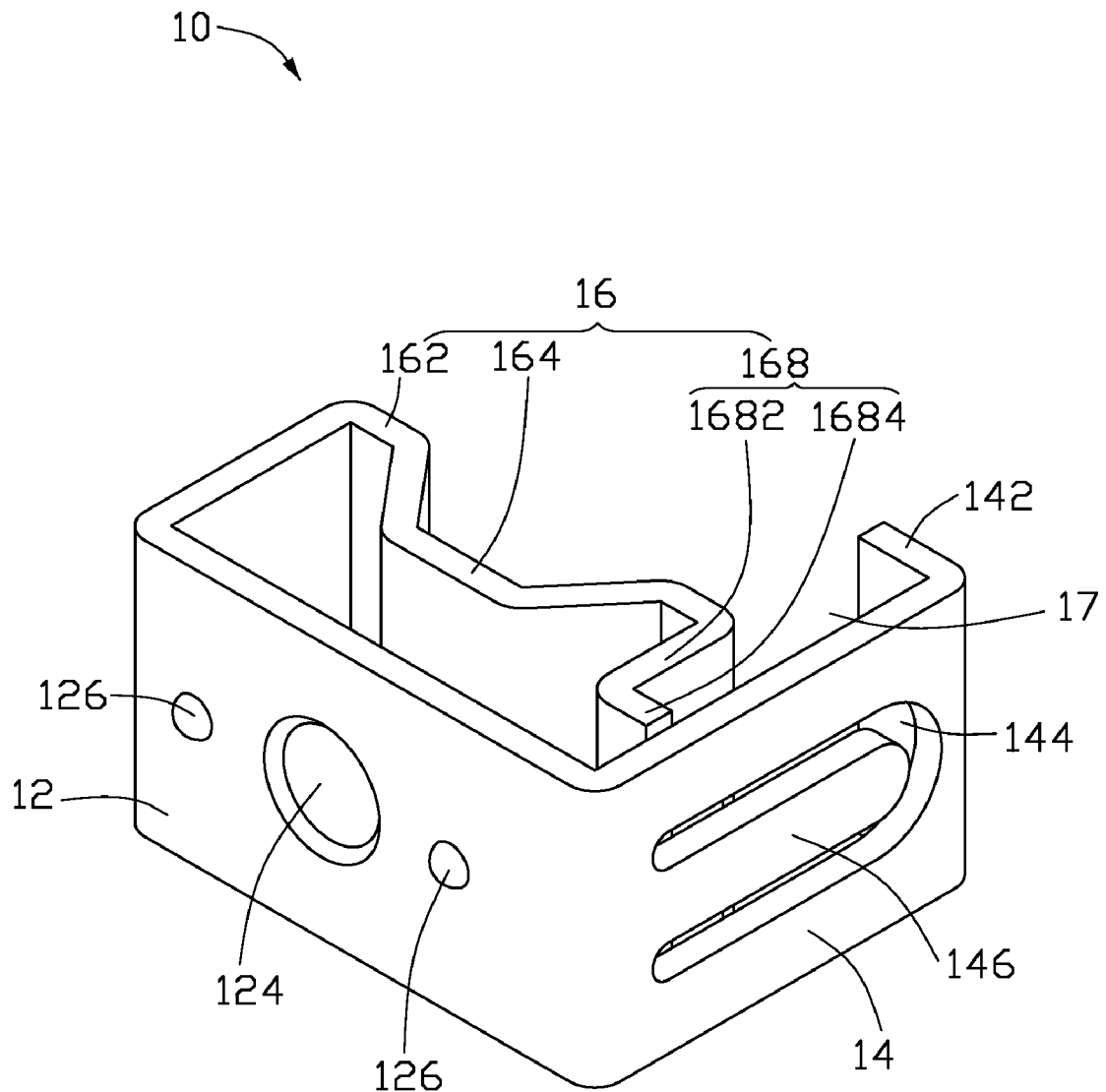
FIG. 1 is a perspective view of a PCB bracket in accordance with one embodiment of the present disclosure.
Figure 2:
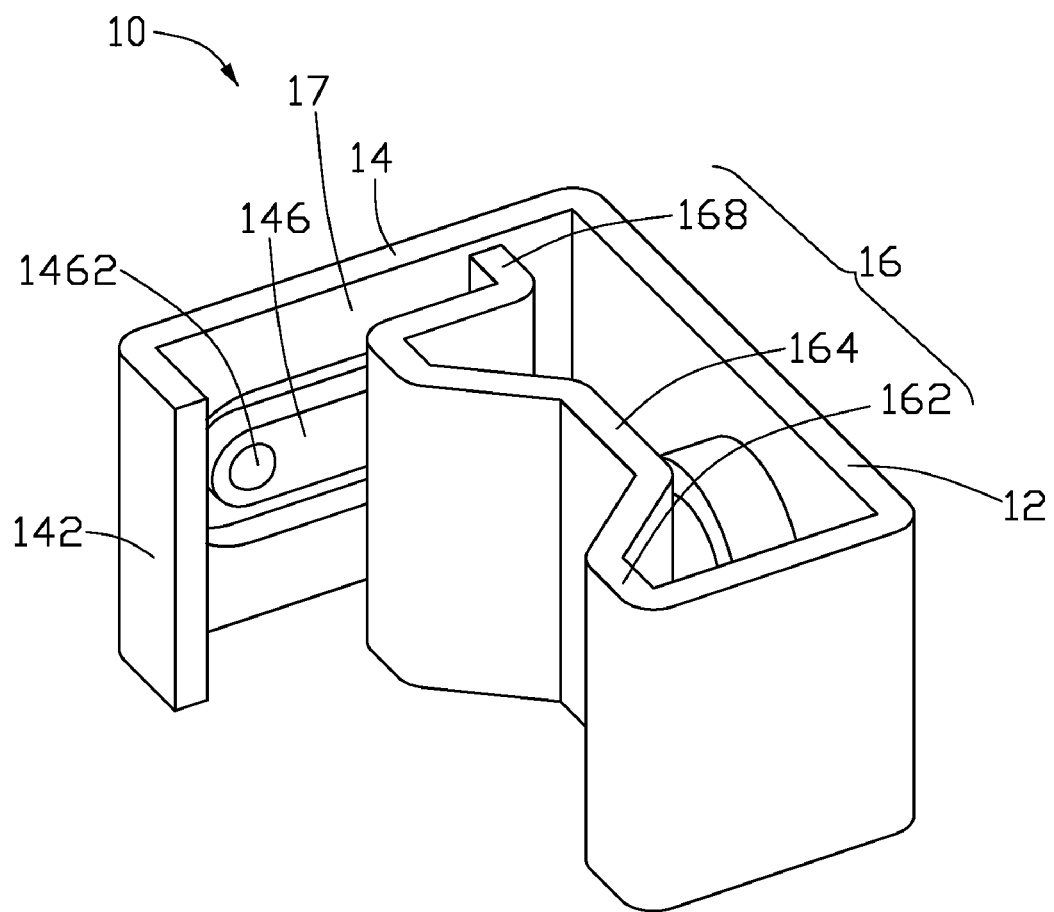
FIG. 2 is a perspective view from another direction of FIG. 1.
Figure 3:
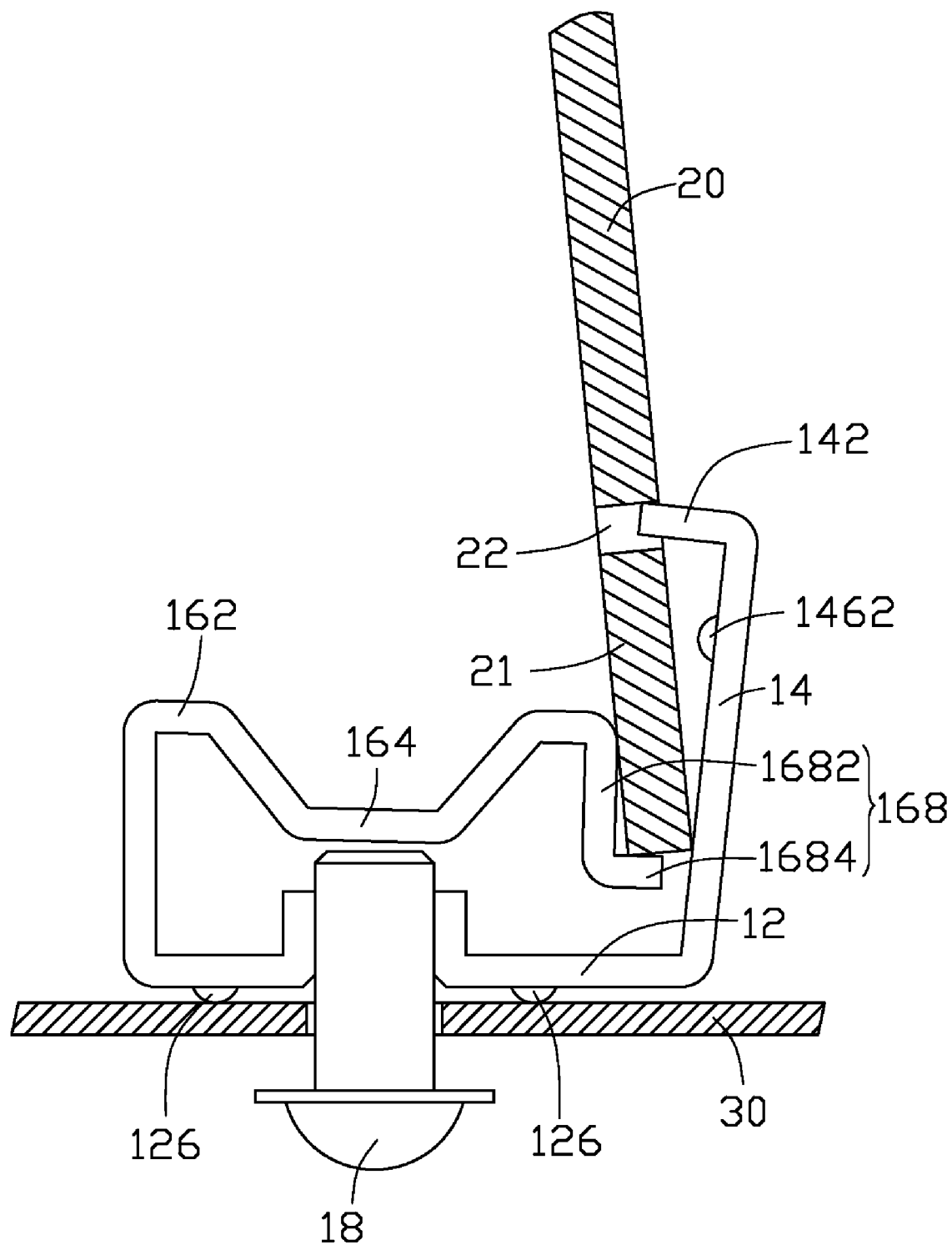
FIG. 3 is an assembled view of the PCB bracket of FIG. 1, which is installed in an electronic device and with a PCB installed therein, showing in an unlatched position.
Figure 4:
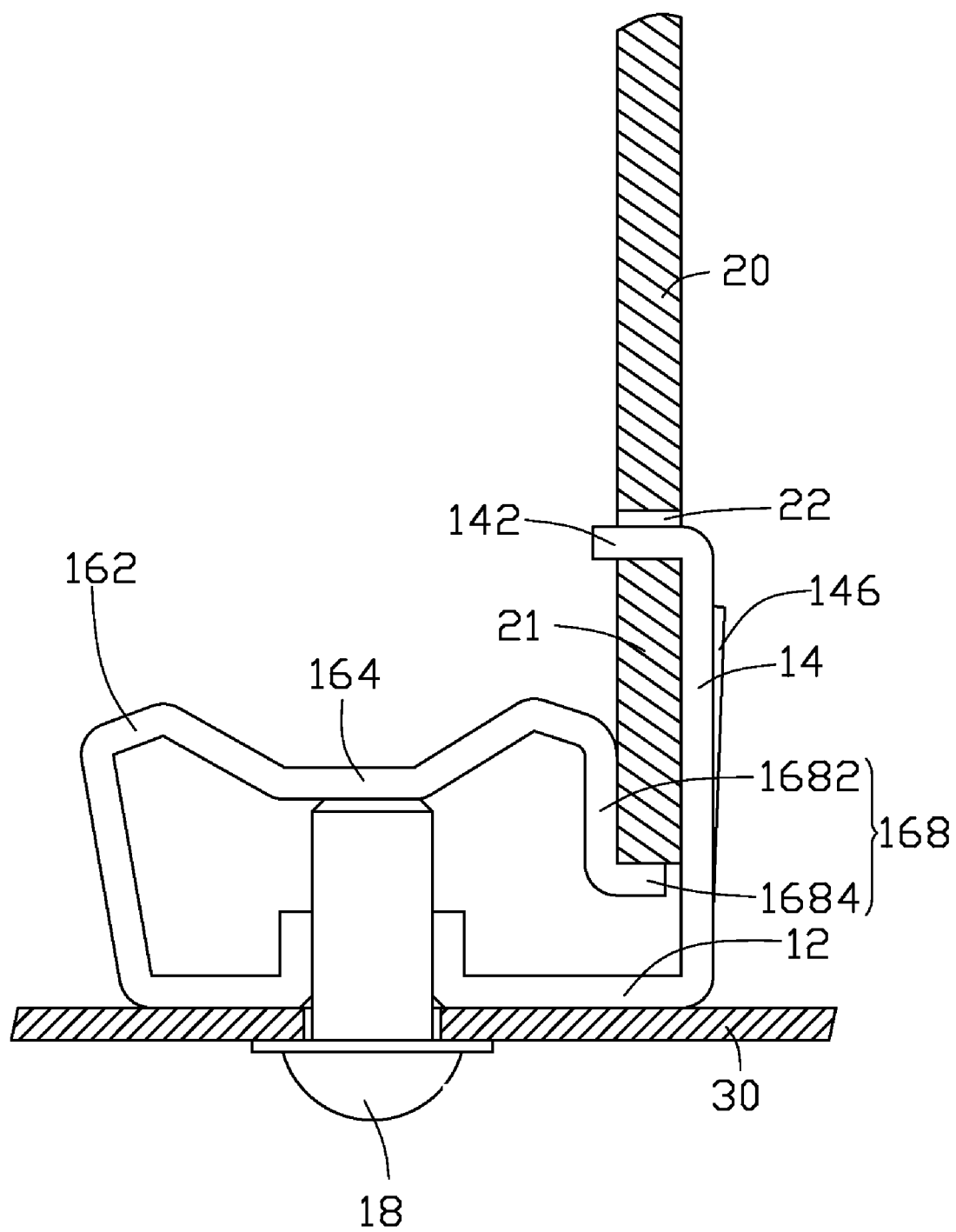
FIG. 4 is similar to FIG. 3, showing in a latched position.

Referring to FIG. 1-FIG. 4, a PCB bracket 10 according to one embodiment of the present disclosure is illustrated, which is used to fix a PCB 20 to an enclosure 30 of an electronic device. In this embodiment, the PCB 20 is a daughter PCB of the electronic device, and communicates with a main board (not shown) of the electronic device. For reliable fixation, the PCB 20 specifically defines a positioning hole 22 matching the PCB bracket 10. The PCB bracket 10 includes a base portion 12, a supporting arm 14, a spring arm 16 and a screw 18. In one embodiment, the PCB bracket 10 may be manufactured by bending a metal sheet.

The base portion 12 defines a screw hole 124 and is fixed to the enclosure 30 with the screw 18 extending through the enclosure 30 and screwed in the screw hole 124. In this embodiment, the base portion 12 includes at least one protrusion 126, which abuts against an inner side of the enclosure 30 of the electronic device to improve grounding performance between the PCB bracket 10 and the enclosure 30.

The supporting arm 14 vertically extends from one end of the base portion 12 and includes a first clamping portion 142 apart from and parallel with the base portion 12. The first clamping portion 142 is adapted to be inserted into the positioning hole 22 of the PCB 20. The supporting arm 14 includes a spring sheet 146, which is integrated formed by cutting a U-shaped slot 144 in the supporting arm 14. The spring sheet 146 includes a protrusion 1462, provided to reliably maintain contact with the PCB 20. In this embodiment, the supporting arm 14 vertically extends from one end of the base portion 12.

The spring arm 16 extends from the other end of the base portion 12 and toward the supporting arm 14. The spring arm 16 includes a connecting portion 162, an urging portion 164 and a second clamping portion 168. The second clamping portion 168 is disposed between the first clamping portion 142 and the base portion 12, to clip the PCB 20 with the first clamping portion 142. In this embodiment, the second clamping portion 168 is substantially L-shaped, and includes a first clamping sheet 1682 and a second clamping sheet 1684, which are perpendicular to each other. The second clamping sheet 1684 is opposite to and parallel with the first clamping portion 142. A receiving room 17 is formed between the second clamping portion 168 and the supporting arm 14 to receive an edge portion 21 of the PCB 20.

The urging portion 164 is connected between the connecting portion 162 and the second clamping portion 168, and faces the screw hole 124 of the base portion 12. During installation of the PCB 20 to the PCB bracket 10, the edge portion 21 of the PCB 20 is supported on the second clamping portion 168, and the first clamping portion 142 of the supporting arm 14 is inserted into the positioning hole 22 of the PCB 20. Finally, the screw 18 is tightly screwed through the enclosure, the screw hole 124 of the base portion 12 and abuts against the urging portion 164, so that the spring arm 16 is out of shape and drives the first clamping portion 168 towards the second clamping portion 142 to fasten the PCB 20.

The PCB bracket 10 is manufactured by bending a metal sheet and has a very simple structure. The PCB bracket 10 fastens the PCB 20 by tightening the screw 18 to deform the spring arm 16 to make the first clamping portion 142 and the second clamping portion 168 cooperatively fasten the PCB 20, simply and efficiently.

While exemplary embodiments have been described, it should be understood that they have been presented by way of example only and not by way of limitation. The breadth and scope of the disclosure should not be limited by the described exemplary embodiments, but only in accordance with the following claims and their equivalents.

What is claimed is:

1. A printed circuit board (PCB) bracket used to fasten a PCB with a positioning hole to an enclosure of an electronic device, the PCB bracket comprising:
   a base portion, defining a screw hole;
   a supporting arm, vertically extending from one end of the base portion and comprising a first clamping portion apart from and parallel with the base portion, wherein the first clamping portion is adapted to be inserted into the positioning hole of the PCB;
   a spring arm, extending from the other end of the base portion and toward the supporting arm, and comprising a second clamping portion disposed between the first clamping portion and the base portion, to clip the PCB cooperatively with the first clamping portion; and
   a screw, screwed through the enclosure, the screw hole of the base portion and abutting against the urging portion, so that the spring arm is out of shape and drives the first clamping portion toward the second clamping portion so as to fasten the PCB;
   wherein the spring arm further comprises a connecting portion and an urging portion, the urging portion connected between the connecting portion and the second clamping portion and facing to the screw hole of the base portion.

2. The PCB bracket as claimed in claim 1, wherein the second clamping portion includes a first clamping sheet and a second clamping sheet perpendicular to the first clamping sheet.

3. The PCB bracket as claimed in claim 1, wherein the supporting arm comprises a spring sheet, which is integrated formed by cutting a U-shaped slot in the supporting arm.

4. The PCB bracket as claimed in claim 3, wherein the spring sheet comprises a protrusion, to reliably contact with the PCB.

5. The PCB bracket as claimed in claim 1, wherein the base portion comprises at least one protrusion abutting against the enclosure of the electronic device to improve grounding performance between the PCB bracket and the enclosure.

* * * * *